United States Patent
Taki et al.

(10) Patent No.: US 9,885,733 B2
(45) Date of Patent: Feb. 6, 2018

(54) MANUFACTURING METHOD FOR MAGNETIC ENCODER

(71) Applicant: NAKANISHI METAL WORKS CO., LTD., Osaka-shi (JP)

(72) Inventors: Masayuki Taki, Osaka (JP); Mitsuru Saitoh, Osaka (JP)

(73) Assignee: NAKANISHI METAL WORKS CO., LTD., Osaka-shi (JP)

( * ) Notice: Subject to any disclaimer, the term of this patent is extended or adjusted under 35 U.S.C. 154(b) by 245 days.

(21) Appl. No.: 14/710,849

(22) Filed: May 13, 2015

(65) Prior Publication Data

US 2016/0025515 A1    Jan. 28, 2016

(30) Foreign Application Priority Data

Jun. 11, 2014  (JP) .................. 2014-120145

(51) Int. Cl.
  *G01P 3/44* (2006.01)
  *G01R 33/00* (2006.01)
  *G01P 3/487* (2006.01)
  *B29C 45/14* (2006.01)
  *G01D 5/12* (2006.01)
  *G01D 5/244* (2006.01)
  *B29L 31/34* (2006.01)

(52) U.S. Cl.
  CPC ............ *G01P 3/44* (2013.01); *B29C 45/1459* (2013.01); *G01D 5/12* (2013.01); *G01D 5/24438* (2013.01); *G01P 3/443* (2013.01); *G01P 3/487* (2013.01); *G01R 33/0052* (2013.01); *B29L 2031/34* (2013.01); *Y10T 29/4902* (2015.01); *Y10T 29/49075* (2015.01)

(58) Field of Classification Search
  CPC . G01P 3/443; G01P 3/487; G01P 3/44; G01D 5/12; G01D 5/24438; G01R 33/0052; B29C 45/1459; B29L 2031/34; Y10T 29/4902; Y10T 29/49075
  See application file for complete search history.

(56) References Cited

U.S. PATENT DOCUMENTS

| 2004/0239532 A1* | 12/2004 | Teshima ................. G01P 3/443 341/15 |
| 2005/0200350 A1* | 9/2005 | Tomioka ................. G01P 3/487 324/174 |

FOREIGN PATENT DOCUMENTS

| JP | 2003-156059 A1 | 5/2003 |
| JP | 2007127446 A * | 5/2007 |
| JP | 2007-271506 A1 | 10/2007 |

* cited by examiner

*Primary Examiner* — A. Dexter Tugbang
(74) *Attorney, Agent, or Firm* — Kratz, Quintos & Hanson, LLP (57) ABSTRACT

Provided is a manufacturing method of an axial-type magnetic. The manufacturing method includes a press molding step and an injection molding step. The axial-type magnetic encoder includes a wrap-around binding part wrapping around from a sensor-opposed surface to a back surface of an inward flange part of an annular fixing member. A separated inner peripheral part separated from a rotating body is formed at an inner diameter-side portion of the inward flange part while an outer diameter-side portion of a back surface of the inward flange part is abutted against the rotating body. The inner peripheral part of the annular plastic magnet wraps around to a back surface of the separated inner peripheral part.

1 Claim, 6 Drawing Sheets

MANUFACTURING METHOD FOR MAGNETIC ENCODER

TECHNICAL FIELD

The present invention relates to an axial-type magnetic encoder that is composed of a metallic annular fixing member and an annular plastic magnet attached to a sensor-opposed surface of an inward flange part of the annular fixing member, and a manufacturing method thereof.

BACKGROUND ART

The magnetic encoder device used to detect the rotating speed (number of rotations) of a rotating body has a variety of number of applications and is composed of a magnetic encoder including an annular fixing member for attachment to the rotating body and an annular magnet member that is fixed to the fixing member and has N and S poles magnetized circumferentially at regular intervals in a multipolar manner; and a sensor that is attached to a non-rotating body so as to be opposed to the magnet member for detecting rotation of the magnet member.

When the magnetic reading diameter of the sensor is small for a rotating body to which an axial-type magnetic encoder is to be attached, a magnetic encoder used is configured such that an annular fixing member to be fitted to the rotating body is formed by a cylindrical part and an inward flange part that is extended radially inward from an end edge of the cylindrical part, and the annular magnet member is fixed to the inward flange part (for example, refer to Patent Document 1, FIG. 3, and Patent Document 2, FIGS. 1 to 13. Hereinafter, referred to as "inward flange-type magnetic encoder").

In such an inward flange-type magnetic encoder, a wrap-around binding part is formed at an inner peripheral part of the annular plastic magnet to wrap around from the sensor-opposed surface to the back surface of the inward flange part of the annular fixing member, thereby to suppress falling of the annular plastic magnet from the annular fixing member due to mechanical binding force and improve reliability of binding of the two components (refer to Patent Document 2, FIGS. 2 and 11).

CITATION LIST

Patent Literatures

Patent Document 1: JP-A No. 2003-156059
Patent Document 2: JP-A No. 2007-271506

SUMMARY OF INVENTION

Technical Problem

Figure 7A:
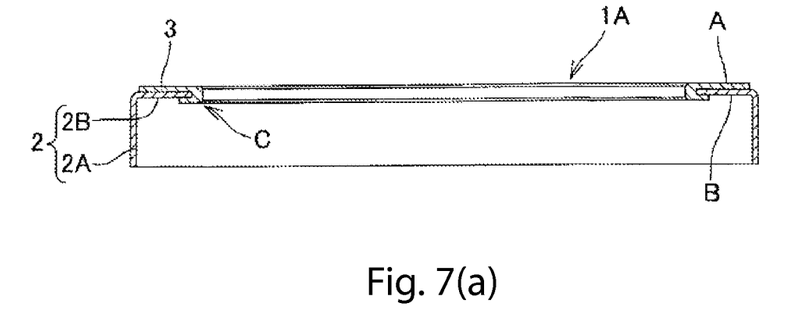
Figure 7B:
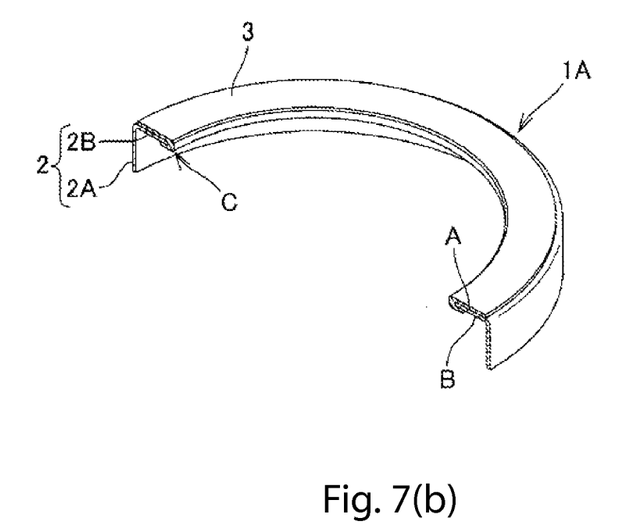
Figure 8A:
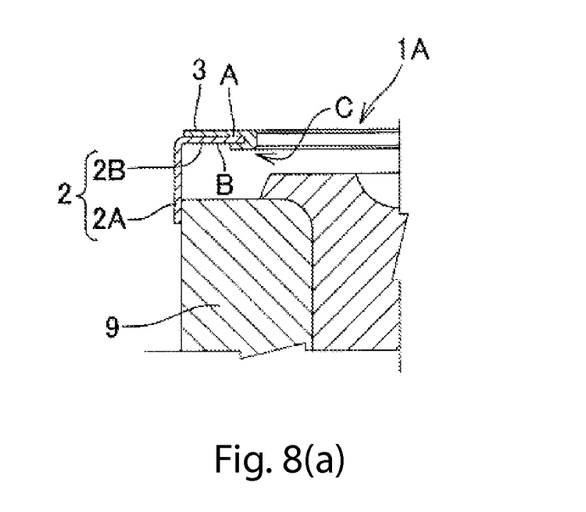
FIG. 8(a) is an enlarged vertical cross-sectional view of major components of the conventional inward flange-type magnetic encoder attached to an inner ring as a rotating body.

There arises no problem in attaching a conventional axial-type magnetic encoder 1A including a wrap-around binding part C shown in the vertical cross-sectional view of FIG. 7(a) and the partial vertical perspective view of FIG. 7(b), to an inner ring 9 as a rotating body as shown in the enlarged vertical cross-sectional view of major components of FIG. 8(a), because the wrap-around binding part C does not interfere with the inner ring 9.

Figure 8B:
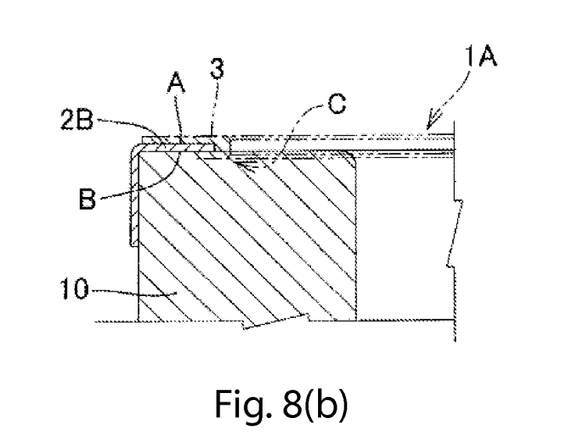
FIG. 8(b) is an enlarged vertical cross-sectional view of major components of the conventional inward flange-type magnetic encoder for describing problems in attaching the magnetic encoder to an outer ring as a rotating body.

However, to attach the magnetic encoder 1A to an outer ring 10 as a rotating body as shown in the enlarged vertical cross-sectional view of major components of FIG. 8(b), an inward flange part 2B needs to be closely attached to the end surface of the outer ring 10 as an axial reference surface for assembly of the magnetic encoder 1A, to prevent the end surface of the outer ring 10 from being hidden behind the magnetic encoder 1A (also refer to Patent Document 1, FIG. 3).

Therefore, the magnetic encoder 1A needs to be shaped without the wrap-around binding part C (refer to Patent Document 1, FIG. 3) because the wrap-around binding part C interferes with the outer ring 10 as shown in FIG. 8(b). When the rotating body is the outer ring 10, there is a problem that it is not possible to improve reliability of binding of the annular fixing member and the annular plastic magnet.

When the magnetic encoder 1A is axially positioned while the plastic wrap-around binding part C is abutted against the end surface of the outer ring 10, the accuracy of positioning axially the magnetic encoder 1A becomes lower and the wrap-around binding part C may be broken.

In light of the foregoing circumstances, an object of the present invention is to provide a magnetic encoder that improves reliability of binding of the annular fixing member and the annular plastic magnet even when the magnetic encoder is to be attached to an outer ring.

Solution to Problem

To solve the foregoing problem, a magnetic encoder according to the present invention is an axial-type magnetic encoder including: an annular fixing member that has a cylindrical part attached to a rotating body and an inward flange part extended more radially inward than an end edge of the cylindrical part; and an annular plastic magnet that is attached to a sensor-opposed surface of the inward flange part and has at an inner peripheral part a wrap-around binding part wrapping around from the sensor-opposed surface to a back surface, wherein a separated inner peripheral part separated from the rotating body is formed at an inner diameter-side portion of the inward flange part while an outer diameter-side portion of a back surface of the inward flange part is abutted against the rotating body, the inner peripheral part of the annular plastic magnet wraps around to a back surface of the separated inner peripheral part, and the wrap-around binding part of the annular plastic magnet wrapping around to the back surface of the separated inner peripheral part does not come closer to the rotating body than the outer diameter-side portion of the back surface of the inward flange part.

To solve the foregoing problem, a manufacturing method of a magnetic encoder according to the present invention is a manufacturing method of an axial-type magnetic encoder including: a press molding step of fabricating by press molding an annular fixing member that has a cylindrical part attached to a rotating body and an inward flange part extended more radially inward than an end edge of the cylindrical part; and an injection molding step of, while the annular fixing member is placed in a metal mold, injecting a dissolved annular plastic magnet material into the metal mold, wherein the manufacturing method includes a step of forming by a press process or mechanical process a separated inner peripheral part separated from the rotating body at an inner diameter-side portion of the inward flange part of the annular fixing member having undergone the press molding step while an outer diameter-side portion of a back surface of the inward flange part is abutted against the rotating body, the metal mold defining the shape of the annular plastic magnet to be attached to the annular fixing member at the injection molding step is shaped such that an inner peripheral part of the annular plastic magnet wraps around to a back surface of the separated inner peripheral part and a wrap-around binding part of the annular plastic magnet wrapping around to the back surface of the separated inner peripheral part does not come closer to the rotating body than an outer diameter-side portion of the back surface of the inward flange part.

Advantageous Effects of Invention

According to the magnetic encoder in the present invention and a magnetic encoder manufactured by the manufacturing method of a magnetic encoder in the present invention as described above, the magnetic encoder is configured such that a separated inner peripheral part separated from the rotating body is formed at an inner diameter-side portion of the inward flange part of the annular fixing member while an outer diameter-side portion of a back surface of the inward flange part is abutted against the rotating body, the inner peripheral part of the annular plastic magnet wraps around to a back surface of the separated inner peripheral part, and the wrap-around binding part of the annular plastic magnet wrapping around to the back surface of the separated inner peripheral part does not come closer to the rotating body than the outer diameter-side portion of the back surface of the inward flange part. Therefore, the magnetic encoder can be axially positioned relative to the reference surface of the rotating body by abutting the outer diameter-side portion of the back surface of the inward flange part of the annular fixing member against the rotating body.

Further, even when the outer diameter-side portion of the back surface of the inward flange part of the annular fixing member is abutted against the rotating body, the wrap-around binding part of the annular plastic magnet does not come closer to the rotating body than the outer diameter-side portion of the back surface of the inward flange part, and therefore the wrap-around part is not broken.

Moreover, the wrap-around binding part of the annular plastic magnet wraps around to the back surface of the separated inner peripheral part formed at the inner peripheral part of the annular plastic magnet, which makes it possible to improve reliability of binding of the annular fixing member and the annular plastic magnet by mechanical binding force of the wrap-around binding part.

BRIEF DESCRIPTION OF DRAWINGS

FIGS. 1(a) and 1(b) show a magnetic encoder according to a first embodiment of the present invention: FIG. 1(a) is a vertical cross-sectional view and FIG. 1(b) is a partial vertical perspective view;

FIGS. 3(a) and 3(b) represent enlarged vertical cross-sectional views of major components of the magnetic encoder: FIG. 3(a) shows an annular fixing member and FIG. 3(b) shows the magnetic encoder;

FIGS. 4(a) and 4(b) represent enlarged vertical cross-sectional views of major components of a magnetic encoder according to a second embodiment: FIG. 4(a) shows an annular fixing member and FIG. 4(b) shows the magnetic encoder;

FIGS. 5(a) and 5(b) represent enlarged vertical cross-sectional views of major components of a magnetic encoder according to a third embodiment: FIG. 5(a) shows an annular fixing member and FIG. 5(b) shows the magnetic encoder;

FIGS. 6(a) and 6(b) represent enlarged vertical cross-sectional views of major components of a magnetic encoder according to a fourth embodiment: FIG. 6(a) shows an annular fixing member; and FIG. 6(b) shows the magnetic encoder;

FIGS. 7(a) and 7(b) show a conventional inward flange-type magnetic encoder: FIG. 7(a) is a vertical cross-sectional view and FIG. 7(b) is a partial vertical perspective view.

DESCRIPTION OF EMBODIMENTS

Next, embodiments of the present invention will be described below in detail with reference to the attached drawings. The present invention is not limited to the embodiments shown in the attached drawings but includes all of embodiments satisfying the requirements described in the claims.

First Embodiment

Figure 1A:
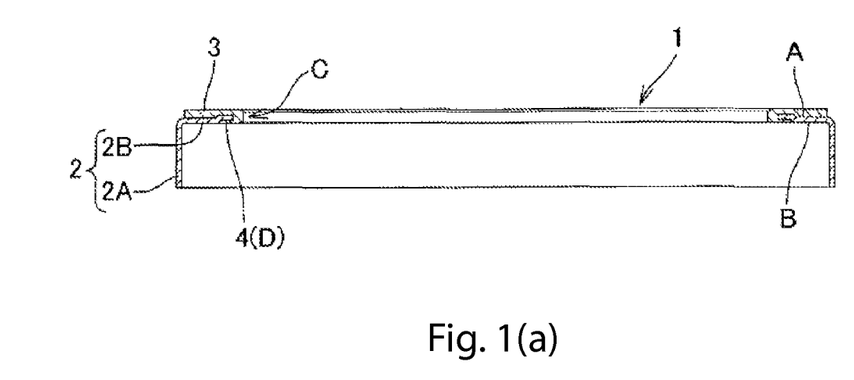
Figure 1B:
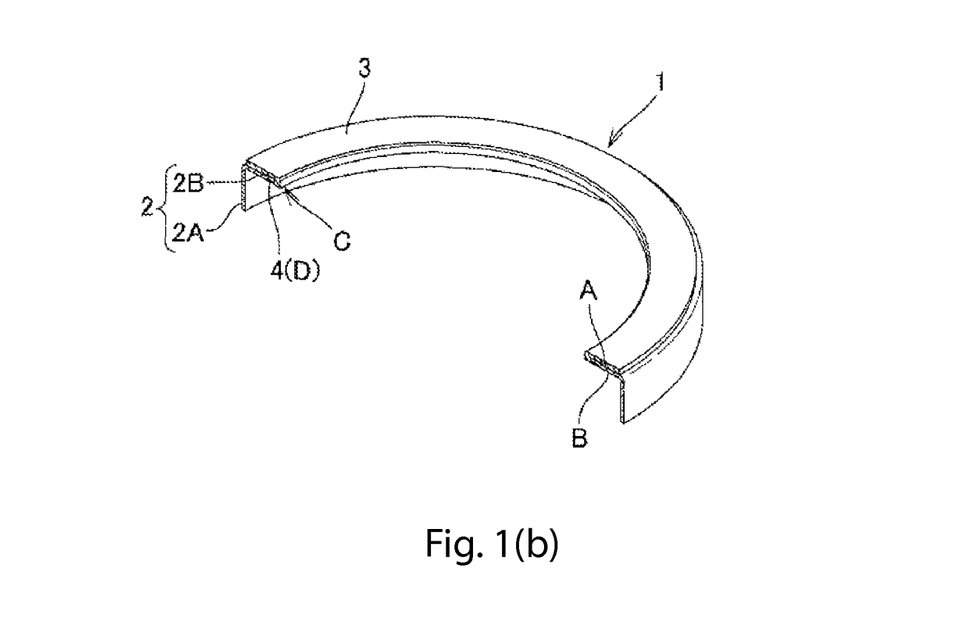
Figure 2:
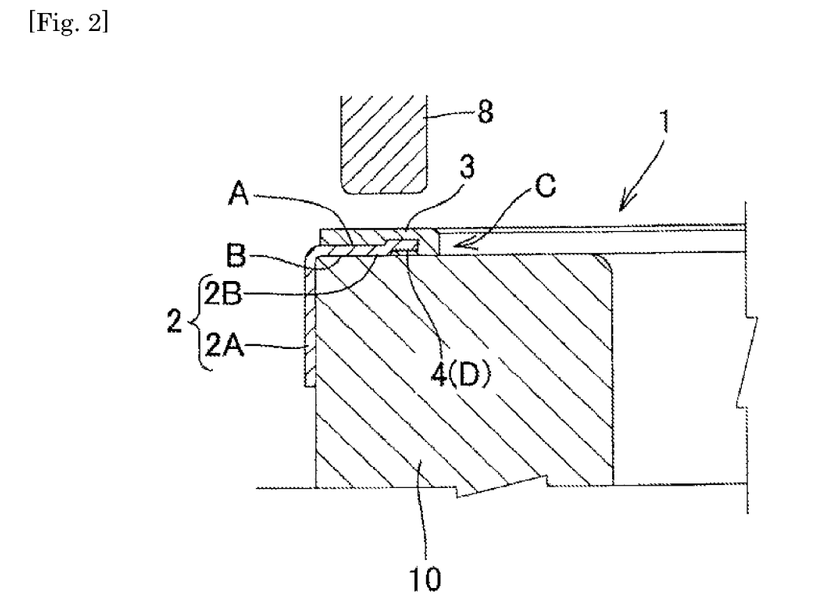
FIG. 2 is an enlarged vertical cross-sectional view of major components of the magnetic encoder attached to an outer ring as a rotating body.
Figure 3A:
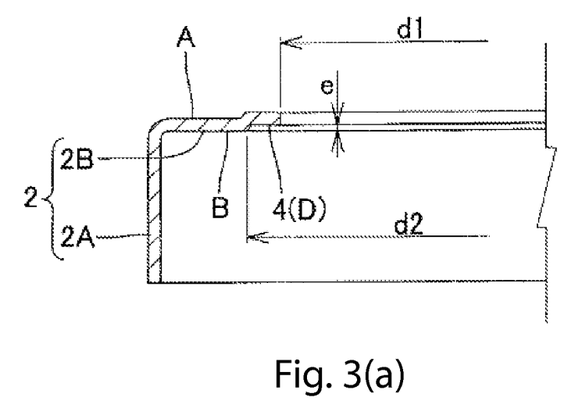
Figure 3B:
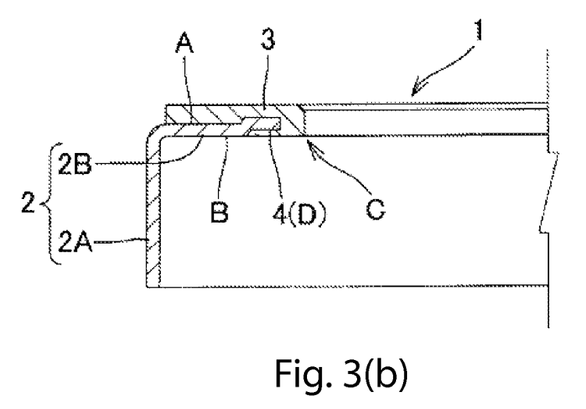

As shown in the vertical cross-sectional view of FIG. 1(a), the partial vertical perspective view of FIG. 1(b), the enlarged vertical cross-sectional view of major components of FIG. 2, and the enlarged vertical cross-sectional view of major components of FIG. 3(b), an axial-type magnetic encoder 1 according to the first embodiment of the present invention is an inward flange type and includes an annular fixing member 2 and an annular plastic magnet 3 attached to the annular fixing member 2.

The annular fixing member 2 shown in the enlarged vertical cross-sectional view of major components of FIG. 3(a) is composed of a cylindrical part 2A attached to an outer ring 10 as a rotating body (refer to FIG. 2) and an inward flange part 2B extended radially inward from an end edge of the cylindrical part 2A, and is fabricated from a stainless steel plate material at a press molding step.

Specifically, the annular fixing member 2 is press-molded by a squeezing process into a general shape as shown in FIGS. 7(a), 7(b), 8(a) and 8(b), and then a stepwise pressing process is performed on an inner diameter-side portion of the inward flange part 2B to form a stepwise pressed portion 4 as a separated inner peripheral part D separated from the outer ring 10 while an outer diameter-side portion of a back surface B of the inward flange part 2B is abutted against the outer ring 10 as shown in FIG. 2.

The annular plastic magnet 3 is attached to a surface A of the annular fixing member 2 opposed to a sensor 8 shown in FIG. 2 (hereinafter, referred to as "sensor-opposed surface") at an injection molding step with the annular fixing member 2 shown in FIG. 3(a) as an insert. Specifically, the annular fixing member 2 and the annular plastic magnet 3 are integrated such that a thermoset resin adhesive is applied to the surface (sensor-opposed surface A) of the annular fixing member 2 to be joined to the annular plastic magnet 3, the annular fixing member 2 and the annular plastic magnet 3 are placed in a metal mold, and a dissolved annular plastic magnet material is injected into the metal mold.

The thermoset resin adhesive may be any adhesive for use in general magnetic encoders and, for example, may be a phenolic resin adhesive, an epoxy resin adhesive, or the like. However, the adhesive is not necessarily used but may be omitted depending on the required specifications or the like.

The annular plastic magnet 3 is made of a magnet material containing magnetic substance powder, a binder, and an additive. The magnetic substance powder is preferably ferrite-based magnetic powder such as strontium ferrite or barium ferrite, or neodymium- or samarium-based rare-earth magnetic powder.

The binder is preferably a thermoplastic resin material such as polyamides (PA6, PA12, PA612, and the like) or polyphenylene sulfide (PPS). The additive is preferably an organic additive such as carbon fiber, or an inorganic additive such as glass beads, glass fiber, talk, mica, silicon nitride (ceramic), or crystalline (or non-crystalline) silica.

A wrap-around binding part C is formed at the inner peripheral part of the annular plastic magnet 3 so as to wrap around from the sensor-opposed surface A to the back surface of the stepwise pressed portion 4 as the separated inner peripheral part D. The wrap-around binding part C does not come closer to the outer ring 10 than the outer diameter-side portion of the back surface B of the inward flange part 2B.

For example, a portion of the wrap-around binding part C wrapping around to the back surface of the stepwise pressed portion 4 is formed flush with the outer diameter-side portion of the back surface B of the inward flange part 2B as shown in FIGS. 2 and 3(b).

Specifically, the metal mold defining the shape of the annular plastic magnet 3 to be attached to the annular fixing member 2 at the injection molding step is shaped such that the inner peripheral part of the annular plastic magnet 3 wraps around to the back surface of the stepwise pressed portion 4 as the separated inner peripheral part D of the annular fixing member 2, and the wrap-around binding part C of the annular plastic magnet 3 wrapping around to the back surface of the stepwise pressed portion 4 is flush with the outer diameter-side portion of the back surface B of the inward flange part 2B.

A step e in the stepwise pressed portion 4 as the separated inner peripheral part D formed at the annular fixing member 2 shown in FIG. 3(a) preferably falls within the range of 0.15 to 0.5 mm. When e is smaller than 0.15 mm, the resin does not flow. When e is larger than 0.5 mm, the inner diameter-side portion of the annular plastic magnet 3 at the sensor-opposed surface A side becomes thinner with reduction in strength.

An outer diameter (diameter) d2 of the stepwise pressed portion 4 as the separated inner peripheral part D is preferably larger by the range of 0.3 to 2.0 mm than an inner diameter (diameter) d1 of the inward flange part 2B of the annular fixing member 2 ((d1+0.3 mm)≤d2≤(d1+2.0 mm)). When d2 is smaller than (d1+0.3 mm), no desired binding strength can be obtained due to molding shrinkage. When d2 is larger than (d1+2.0 mm), mechanical binding strength decreases due to lack of resin charging or the like.

According to the thus configured magnetic encoder 1, the magnetic encoder 1 can be axially positioned relative to the reference surface of the outer ring 10 by abutting the outer diameter-side portion of the back surface B of the inward flange part 2B of the annular fixing member 2 against the outer ring 10 as a rotating body as shown in FIG. 2.

In addition, even when the outer diameter-side portion of the back surface B of the inward flange part 2B of the annular fixing member 2 is abutted against the outer ring 10, the wrap-around binding part C of the annular plastic magnet 3 does not come closer to the outer ring 10 than the outer diameter-side portion of the back surface B of the inward flange part 2B, and thus the wrap-around binding part C is not broken.

Further, since the wrap-around binding part C of the annular plastic magnet 3 wraps around to the back surface of the separated inner peripheral part D formed at the inner peripheral part of the annular plastic magnet 3, it is possible to improve reliability of binding of the annular fixing member 2 and the annular plastic magnet 3 by mechanical binding force of the wrap-around binding part C.

As second to fourth embodiments, modifications of the separated inner peripheral part D formed by a pressing process or mechanical process at the inner diameter-side portion of the inward flange part 2B of the annular fixing member 2 will be described below.

Second Embodiment

Figure 4:
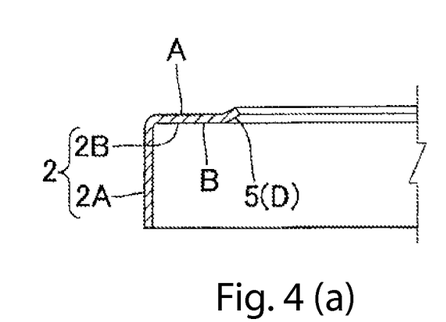

The annular fixing member 2 is press-molded by a squeezing process into a general shape as shown in FIGS. 7(a), 7(b), 8(a) and 8(b), and then the inner diameter-side portion of the inward flange part 2B is subjected to a bending process to form a bent portion 5 with a larger separation distance from the outer ring 10 in a radially inward direction as the separated inner peripheral part D separated from the outer ring 10 while the outer diameter-side portion of the back surface B of the inward flange part 2B is abutted against the outer ring 10 (refer to FIG. 2), as shown in the enlarged vertical cross-sectional view of major components of FIG. 4(a).

While the annular fixing member 2 shown in FIG. 4(a) as an insert is placed in the metal mold, injection molding is performed to form the wrap-around binding part C wrapping around from the sensor-opposed surface A to the back surface of the bent portion 5 as the separated inner peripheral part D at the inner peripheral part of the annular plastic magnet 3, as shown in enlarged vertical cross-sectional view of major components of FIG. 4(b). The wrap-around binding part C does not come closer to the outer ring 10 than the outer diameter-side portion of the back surface B of the inward flange part 2B. For example, a portion wrapping around to the back surface of the bent portion 5 as the separated inner peripheral part D is formed flush with the outer diameter-side portion of the back surface B of the inward flange part 2B as shown in FIG. 4(b).

The magnetic encoder 1 of the second embodiment as described above provides the same advantages as those of the first embodiment.

Third Embodiment

Figure 5:
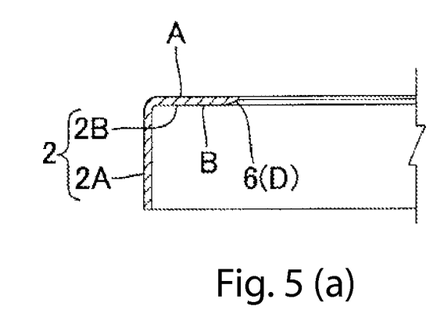

The annular fixing member 2 is press-molded by a squeezing process into a general shape as shown in FIGS. 7(a), 7(b), 8(a) and 8(b), and then the inner diameter-side portion of the inward flange part 2B is subjected to surface pressing or turning to form a back surface inclined portion 6 inclined with a more increasing distance from the outer ring 10 in the radially inward direction as the separated inner peripheral part D separated from the outer ring 10 while the outer diameter-side portion of the back surface B of the inward flange part 2B is abutted against the outer ring 10 (refer to FIG. 2), as shown in the enlarged vertical cross-sectional view of major components of FIG. 5(a).

While the annular fixing member 2 shown in FIG. 5(a) as an insert is placed in the metal mold, injection molding is performed to form the wrap-around binding part C wrapping around from the sensor-opposed surface A to the back surface of the back surface inclined portion 6 as the separated inner peripheral part D at the inner peripheral part of the annular plastic magnet 3, as shown in the enlarged vertical cross-sectional view of major components of FIG. 5(b). The wrap-around binding part C does not come closer to the outer ring 10 than the outer diameter-side portion of the back surface B of the inward flange part 2B. For example, a portion wrapping around to the back surface of the back surface inclined portion 6 as the separated inner peripheral part D is formed flush with the outer diameter-side portion of the back surface B of the inward flange part 2B as shown in FIG. 5(b).

The magnetic encoder 1 of the third embodiment as described above provides the same advantages as those of the first embodiment.

Fourth Embodiment

Figure 6:
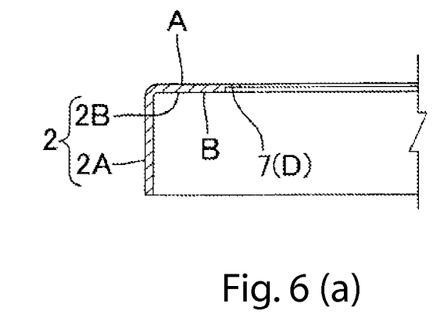

The annular fixing member 2 is press-molded by a squeezing process into a general shape as shown in FIGS. 7(a), 7(b), 8(a) and 8(b), and then the inner diameter-side portion of the inward flange part 2B is subjected to coining or turning to form a thinned portion 7 as the separated inner peripheral part D separated from the outer ring 10 while the outer diameter-side portion of the back surface B of the inward flange part 2B is abutted against the outer ring 10 (refer to FIG. 2), as shown in the enlarged vertical cross-sectional view of major components of FIG. 6(a).

While the annular fixing member 2 shown in FIG. 6(a) as an insert is placed in the metal mold, injection molding is performed to form the wrap-around binding part C wrapping around from the sensor-opposed surface A to the back surface of the thinned portion 7 as the separated inner peripheral part D at the inner peripheral part of the annular plastic magnet 3, as shown in enlarged vertical cross-sectional view of major components of FIG. 6(b). The wrap-around binding part C does not come closer to the outer ring 10 than the outer diameter-side portion of the back surface B of the inward flange part 2B. For example, a portion wrapping around to the back surface of the thinned portion 7 as the separated inner peripheral part D is formed flush with the outer diameter-side portion of the back surface B of the inward flange part 2B as shown in FIG. 6(b).

The magnetic encoder 1 of the fourth embodiment as described above provides the same advantages as those of the first embodiment.

In the foregoing description, the magnetic encoder is attached to an outer ring as a rotating body. Alternatively, the magnetic encoder may be attached to an inner ring as a rotating body.

In the foregoing description, the annular fixing member of the magnetic encoder is composed of the cylindrical part and the inward flange part extended radially inward from the end edge of the cylindrical part. Alternatively, the annular fixing member may include the cylindrical part and an inward flange part extended more radially inward than the end edge of the cylindrical part.

REFERENCE SIGNS LIST 1, 1A Magnetic encoder
2 Annular fixing member
2A Cylindrical part
2B Inward flange part
3 Annular plastic magnet
4 Stepwise pressed portion
5 Bent portion
6 Back surface inclined portion
7 Thinned portion
8 Sensor
9 Inner ring at rotating side (rotating body)
10 Outer ring at rotating side (rotating body)
A Sensor-opposed surface
B Back surface
C Wrap-around binding part
D Separated inner peripheral part
d1 Inner diameter
d2 Outer diameter of step
e Step

The invention claimed is:

1. A manufacturing method of an axial-type magnetic encoder, comprising:
a press molding step of fabricating by press molding an annular fixing member that has a cylindrical part attached to a rotating body and an inward flange part extended more radially inward than an end edge of the cylindrical part; and
an injection molding step of, while the annular fixing member is placed in a metal mold, injecting a dissolved annular plastic magnet material into the metal mold to define a shape of an annular plastic magnet, wherein
the manufacturing method includes a step of forming, by a press process or mechanical process, a separated inner peripheral part formed at an inner diameter-side portion of the inward flange part of the annular fixing member that is separated from the rotating body, the inward flange part of the annular fixing member having undergone the press molding step further includes an outer diameter-side portion of a back surface of the inward flange part that is abutted against the rotating body,
the metal mold defining the shape of the annular plastic magnet to be attached to the annular fixing member at the injection molding step is shaped such that an inner peripheral part of the annular plastic magnet wraps around to a back surface of the separated inner peripheral part of the annular fixing member, and a wrap-around binding part of the annular plastic magnet that wraps around to the back surface of the separated inner peripheral part is flush with the outer diameter-side portion of the back surface of the inward flange part.

* * * * *